United States Patent [19]

Ikeda

[11] Patent Number: 5,467,054
[45] Date of Patent: Nov. 14, 1995

[54] OUTPUT CIRCUIT FOR MULTIBIT-OUTPUTTING MEMORY CIRCUIT

[75] Inventor: Minari Ikeda, Tokyo, Japan

[73] Assignee: NEC Corporation, Tokyo, Japan

[21] Appl. No.: 318,087

[22] Filed: Oct. 5, 1994

[30] Foreign Application Priority Data

Oct. 6, 1993 [JP] Japan .................... 5-250272

[51] Int. Cl.⁶ ................... G05F 1/10; G05F 3/02
[52] U.S. Cl. ............ 327/589; 327/387; 327/546
[58] Field of Search .................... 327/387, 546, 327/589

[56] References Cited

U.S. PATENT DOCUMENTS 4,574,203  3/1986  Baba ............................ 327/589
4,698,789  10/1987 Iizuka ........................... 327/537
5,323,067  6/1994  Shay ............................ 327/546

Primary Examiner—Margaret Rae Wambach
Attorney, Agent, or Firm—Sughrue, Mion, Zinn, Macpeak & Seas

[57] ABSTRACT

The output circuit according to this invention includes a first transistor (output transistor) provided between a first power terminal and an output terminal and receiving a first input signal into its gate via a voltage boosting circuit, a second transistor provided between a second power terminal and the output terminal and receiving a second input signal into its gate, a third and a fourth transistors connected in series between the gate of the first transistor and the output terminal with their respective gates connected to the second power terminal, and a fifth transistor provided between the first power terminal and the node of the third and fourth transistors with its gate connected to the gate of the output transistor.

4 Claims, 3 Drawing Sheets

OUTPUT CIRCUIT FOR MULTIBIT-OUTPUTTING MEMORY CIRCUIT

BACKGROUND OF THE INVENTION

1. Field of the Invention

The present invention relates to an output circuit, and more particularly to an output circuit for a memory circuit having a binary signal as an input.

2. Description of the Prior Art

In the semiconductor devices, there is known a type, such as the so-called bytewide, which has a plurality (sixteen, for example) of input and output (I/O) terminals, wherein an I/O circuit is provided for each of these plurality of I/O terminals. Referring to FIG. 1, a conventional output circuit will be described. In FIG. 1, only a specific circuit configuration of the output circuit is illustrated, omitting the description about the input circuit. An output circuit is constituted by connecting in series N-channel transistors Tr1 and Tr2 between a power terminal Vcc and a ground terminal Vss. A signal supplied to a first terminal OUT-A is applied to the gate of the transistor Tr1 via an inverter 11 and a bootstrap circuit 13, and a signal supplied to a second terminal OUT-B is applied to the gate of the transistor Tr2 via an inverter 12. An N-channel transistor Tr3 is connected between the gate of the transistor Tr1 (node A) and the I/O terminal, with its gate connected to the ground terminal Vss.

A boosting signal Bt is applied to the bootstrap circuit 13 to boost the potential of the node A to a value higher than the power supply voltage Vcc. Accordingly, it is possible to boost the potential of the node A, and eventually raise the potential of the I/O terminal to a high level exceeding Vcc, by supplying the boosting signal Bt after the output of the I/O terminal raises the potential Vcc−Vth (where Vth is the threshold voltage of the transistor Tr1) through application of a low level signal and a high level signal to OUT-A and OUT-B, respectively.

Then a high level signal and a low level signal are applied to OUT-A and OUT-B, respectively, the I/O terminal goes to a low level.

To use the I/O terminal as an input terminal, the output circuit is disabled by bringing both transistors Tr1 and Tr2 to the off-state by applying high level signals to OUT-A and OUT-B. The transistor Tr3 is provided to cope with the so-called undershoot condition in which the potential of the I/O terminal in this state becomes lower than the ground potential. That is to say, if the transistor Tr3 were absent, the potential of the I/O terminal would become lower than the ground potential, and the transistor Tr1 would be turned on when the absolute value of the potential exceeds the threshold voltage of the transistor Tr1. At this time, the voltage between the source and the drain of the transistor Tr1 would be higher than Vcc. When the source-drain voltage of a MOS transistor is large, the substrate current, which is a part of the channel current, that flows in the substrate at a pinched-off region of the channels is increased markedly, rising the potential of the substrate. By installing the transistor Tr3, it becomes possible to prevent turning-on of the transistor Tr1 during undershooting by turning on the transistor Tr3 before the transistor Tr1 is turned on, and connecting the node A (which is at the low level at this time) and the I/O terminal.

A memory circuit for multibit output is provided with an output circuit, such as shown in FIG. 1 and described in the above, for every I/O terminal. Now let us consider the read operation of a memory circuit for the case when it has 16, for example, I/O terminals. When one specified I/O terminal goes to the high level and the remaining 15 I/O terminals go to the low level, the 15 output circuits provided corresponding to the 15 I/O terminals simultaneously discharge electric charges to the ground terminal Vss. As a result, there is generated a ground noise in which the ground potential goes up. Note, however, that the ground noise may also be generated due to some other reasons.

If the ground potential exceeds the threshold voltage of the transistor Tr3 shown in FIG. 1, the transistor Tr3 in one specified output circuit is turned on. Consequently, there arises a problem in that it takes a longer time to raise the potential of the node A and the operation of the system becomes slow. Moreover, if the ground noise occurs during application of the boosting signal Bt, the transistor Tr3 is turned on, preventing rise of the potential of the node A beyond Vcc+Vth, which results in a problem that a sufficiently high output level (higher than Vcc) cannot be obtained.

BRIEF SUMMARY OF THE INVENTION

Object of the Invention

It is therefore the object of this invention to provide an output circuit which is capable of producing a sufficiently high output level even if there is generated a ground noise.

Summary of the Invention

The output circuit according to this invention includes a first transistor (output transistor) provided between a first power terminal and an output terminal which receives a first input signal into the gate via a voltage boosting circuit, a second transistor provided between a second power terminal and the output terminal which receives a second input signal into the gate, a third and a fourth transistors connected in series between the gate of the first transistor and the output terminal with the respective gates thereof connected to the second power terminal, and a fifth transistor provided between the first power terminal and the node of the third and the fourth transistors with its gate connected to the gate of the output transistor.

BRIEF DESCRIPTION OF THE DRAWINGS

The above-mentioned and other objects, features and advantages of this invention will become more apparent by reference to the following detailed description of the invention taken in conjunction with the accompanying drawings, wherein.

DETAILED DESCRIPTION OF THE INVENTION

Figure 1:
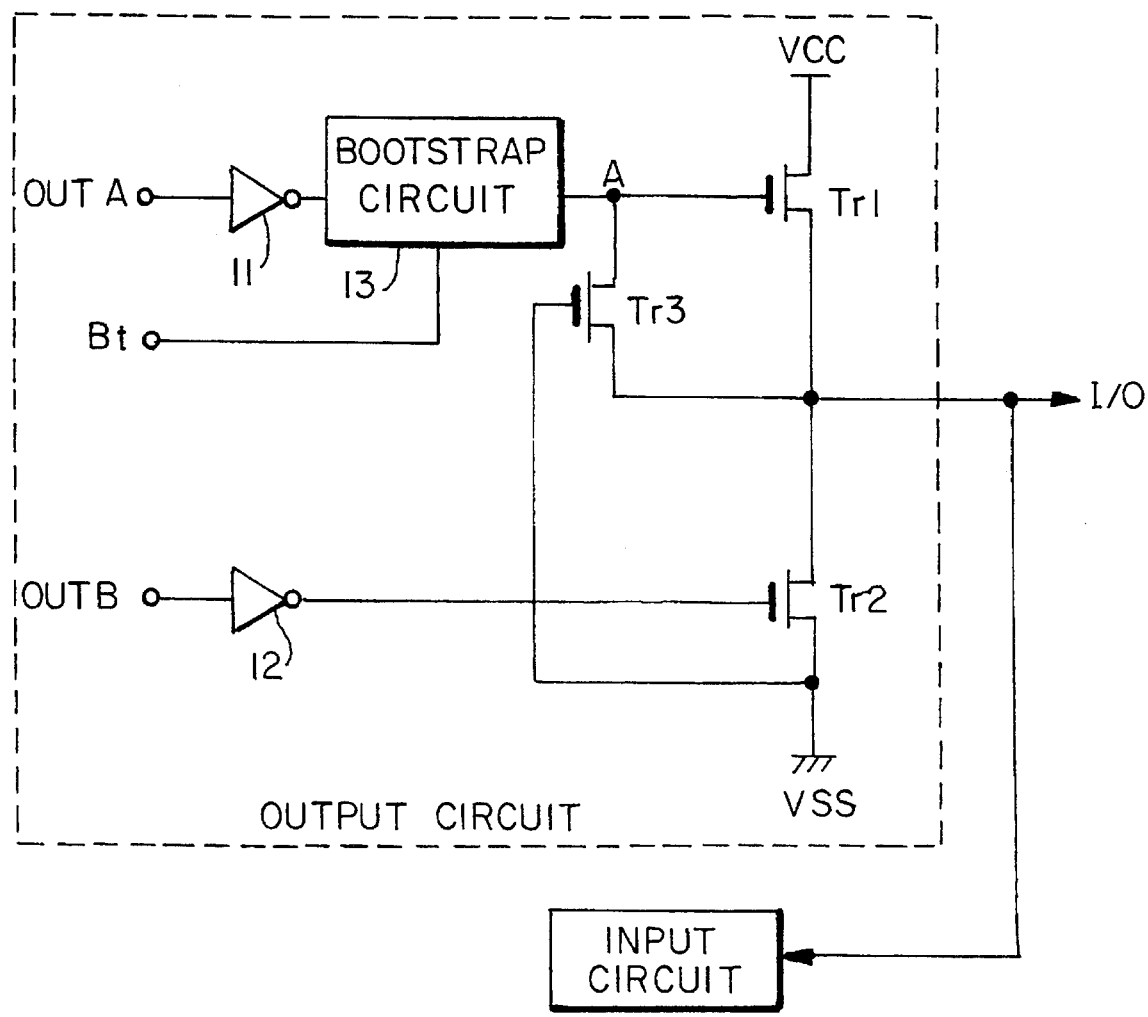
FIG. 1 is a circuit diagram of a conventional output circuit.
Figure 2:
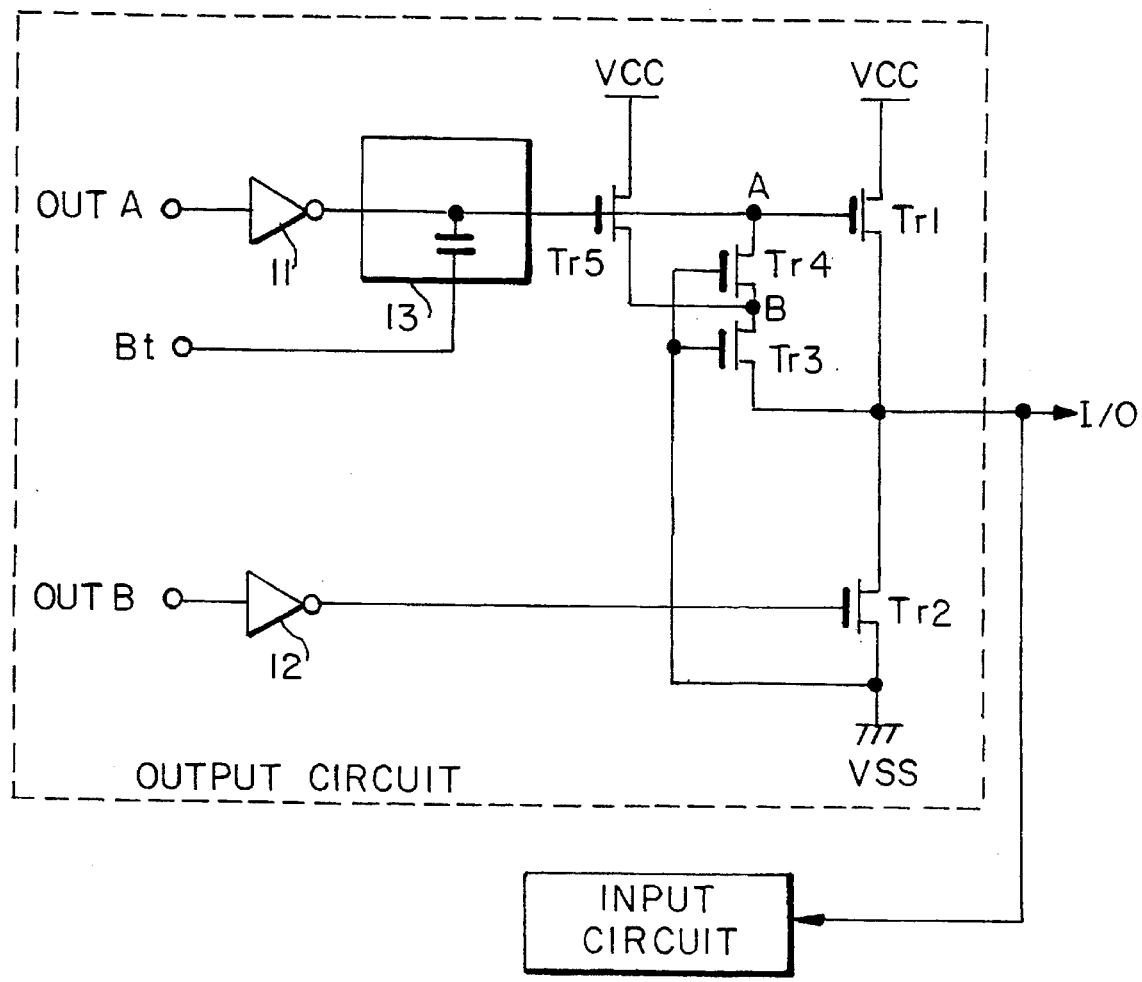
FIG. 2 is a circuit diagram of an embodiment of the output circuit according to this invention.

Referring to FIG. 2, an embodiment of this invention will be described. Components identical to those shown in FIG. 1 will be given identical reference numerals to omit a further description. This embodiment further includes a transistor Tr4 provided between the node A and a node B and has its gate connected to the ground terminal Vss, and a transistor Tr5 provided between the power terminal Vcc and the node B and has its gate connected to the gate of the transistor Tr1.

Figure 3:
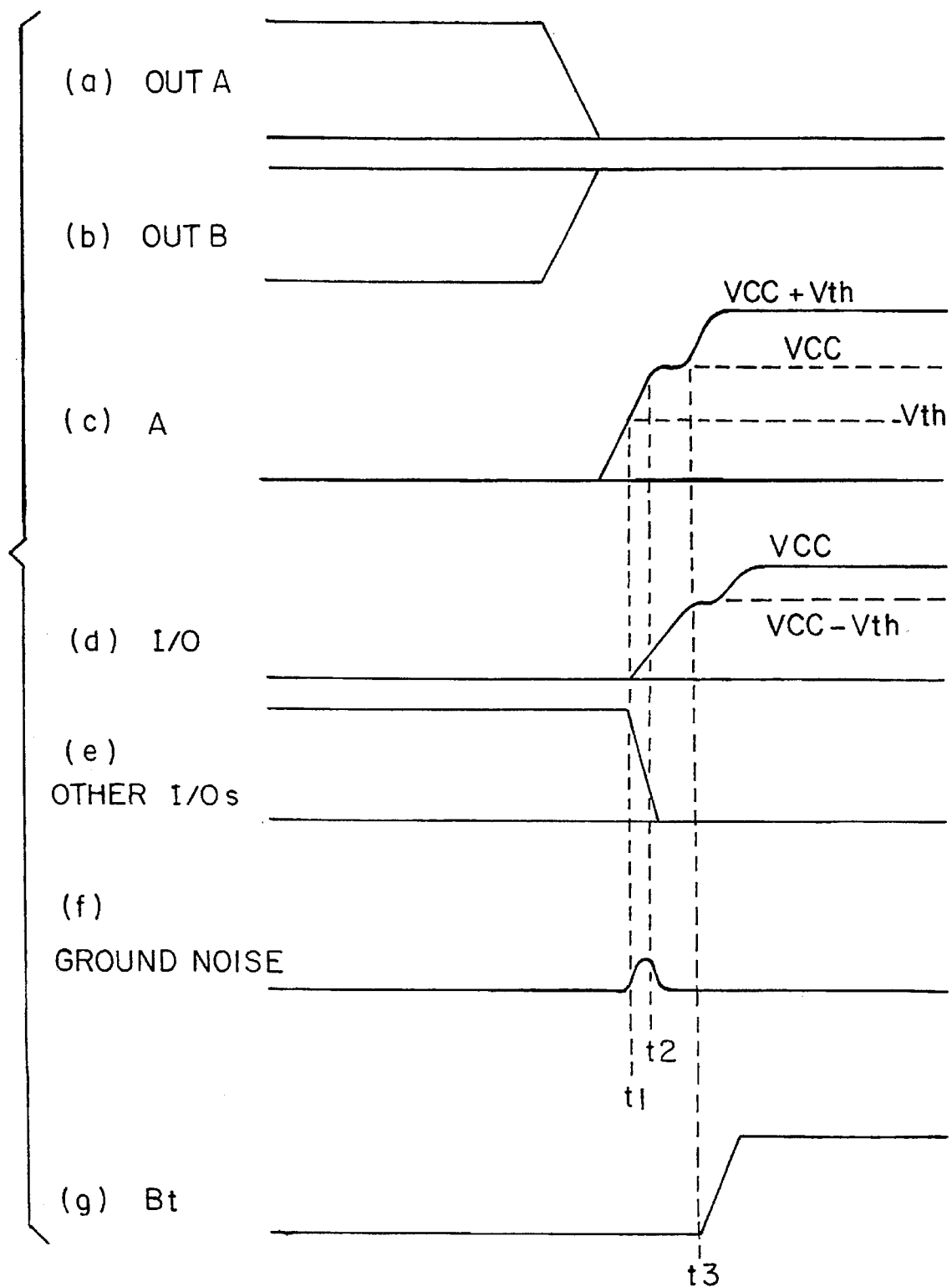
FIG. 3 is an operating waveform diagram of the output circuit shown in FIG. 2.

Referring also to FIG. 3, the operation of the case in which the output circuit shown in FIG. 2 is applied to a memory circuit with multibit (16 bits) output will be described as an example in what follows. When the output of a specified I/O terminal goes from "0" (low level) to "1" (high level), and the outputs of the remaining 15 I/O terminals go from "1" to "0", the output circuits corresponding to the 15 I/O terminals simultaneously execute discharge to the ground power supply, so that a ground noise is generated at the time t2 as shown in FIG. 3(f).

On the other hand, the signal supplied to OUT-A goes from "1" to "0" in the output circuit corresponding to the specified one I/O terminal, so that the potential at its node A goes up. At the time t1, the potential of the node A exceeds the threshold of the transistors Tr1 and Tr5, and the potentials of the I/O terminal and the node B go up. At the time t2 when the ground noise is generated, the potential of the node B is raised to a certain value. Therefore, even if the level of the ground noise exceeds the threshold potential of the transistors Tr3 and Tr4, the transistor Tr4 will not be turned on since the potential of the source of the transistor Tr4 (node B) is raised.

Next, by bringing the boosting signal Bt to the high level at the time t3, the potential of the node A can be made higher than Vcc+Vth and the output of the I/O terminal can be made Vcc. Even if a ground noise is generated during the voltage boosting operation, it will not affect the output of the circuit because the transistor Tr4 will not be turned on.

When the output circuit is in the disabled state, this circuit operates in the same way as in the conventional circuit shown in FIG. 1. Namely, when the so-called undershooting in which the potential of the I/O terminal becomes lower than the ground potential is generated, both the transistors Tr3 and Tr4 are turned on before the transistor Tr1 is turned on, to connect the node A and the I/O terminal. Therefore, it is possible to prevent the energization of the transistor Tr1 during undershooting.

Although the invention has been described with reference to a specific embodiment, this description is not meant to be construed in a limiting sense. Various modifications of the disclosed embodiment will become apparent to persons skilled in the art upon reference to the description of the invention. It is therefore contemplated that the appended claims will cover any modifications or embodiments as fall within the true scope of the invention.

What is claimed is:

1. An output circuit comprising, an output transistor provided between a first power terminal and an output terminal, a voltage boosting circuit for supplying a boosted signal to the gate of said output circuit in response to an input signal, and control means connected to a second power terminal for electrically connecting said output terminal to the gate of said output transistor when the potential of said output terminal becomes lower by more than a predetermined voltage from the potential of said second power terminal while a low level signal is being supplied to the gate of said output transistor, and for electrically isolating said output terminal and said output transistor irrespective of the potential of said second power terminal when a high level signal is supplied to the gate of said output transistor.

2. The output circuit as claimed in claim 1, wherein said control means comprises a first and a second transistors connected in series between the gate of said output transistor and said output terminal, with their respective gates connected to said second power terminal, and a third transistor provided between said first power terminal and the node of said first and second transistors with its gate connected to the gate of said output transistor.

3. The output circuit as claimed in claim 1, wherein said output transistor is an N-channel MOS transistor.

4. An output circuit comprising, a first transistor provided between a first power terminal and an output terminal which receives a first input signal into its gate via a voltage boosting circuit, a second transistor provided between a second power terminal and said output terminal which receives a second input signal into its gate, a third and a fourth transistors connected in series between the gate of said first transistor and said output terminal having their respective gates connected to said second power terminal, and a fifth transistor provided between said first power terminal and the node of said third and fourth transistors with its gate connected to the gate of said output transistor.

* * * * *